(12) United States Patent
Zhong et al.

(10) Patent No.: US 12,392,023 B1
(45) Date of Patent: Aug. 19, 2025

(54) METHODS AND APPARATUS FOR DEPOSITING AMORPHOUS INDIUM TIN OXIDE FILM

(71) Applicant: Applied Materials, Inc., Santa Clara, CA (US)

(72) Inventors: Yaoying Zhong, Singapore (SG); Siew Kit Hoi, Singapore (SG); Palaniappan Chidambaram, Singapore (SG); Jaysen Chiam, Singapore (SG); Li Ying Choo, Singapore (SG); Jay Min Soh, Singapore (SG); Xiao Tan, Singapore (SG); Haomin Xu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/654,389

(22) Filed: May 3, 2024

(51) Int. Cl.
| | |
|---|---|
| *C23C 14/50* | (2006.01) |
| *C23C 14/08* | (2006.01) |
| *C23C 14/34* | (2006.01) |
| *C23C 14/54* | (2006.01) |
| *H01J 37/34* | (2006.01) |

(52) U.S. Cl.
CPC ........ *C23C 14/086* (2013.01); *C23C 14/3414* (2013.01); *C23C 14/345* (2013.01); *C23C 14/50* (2013.01); *C23C 14/54* (2013.01); *H01J 37/3441* (2013.01); *H01J 37/3447* (2013.01)

(58) Field of Classification Search
CPC . C23C 14/086; C23C 14/3414; C23C 14/345; C23C 14/50; C23C 14/54; H01J 37/3447; H01J 37/3441

USPC .......................... 204/298.11, 298.03, 192.13
See application file for complete search history.

(56) References Cited

U.S. PATENT DOCUMENTS

| | | | | |
|---|---|---|---|---|
| 6,296,747 | B1 * | 10/2001 | Tanaka | C23C 14/345 |
| | | | | 204/298.14 |
| 8,728,285 | B2 * | 5/2014 | Demaray | C23C 14/0042 |
| | | | | 204/192.29 |
| 11,670,485 | B2 | 6/2023 | Hoi et al. | |
| 2002/0134671 | A1 | 9/2002 | Demaray et al. | |
| 2018/0350922 | A1 | 12/2018 | Sachet et al. | |
| 2019/0237311 | A1 * | 8/2019 | Allen | C23C 14/564 |

FOREIGN PATENT DOCUMENTS

EP          599071        *    6/1994

OTHER PUBLICATIONS

Yang et al. "ITO films deposited on water-cooled flexible substrate by bias RF Magnetron Sputtering", Applied Surface Science vol. 161, Issues 1-2, Jul. 1, 2000, pp. 279-285. (Year: 2000).*
Machine Translation EP 599071 (Year: 1994).*
Teixeria et al., Amorphous ITO thin films prepared by DC sputtering for electrochromic applications, Thin Solid Films, vols. 4220-421 Dec. 2, 2002, pp. 70-75.

* cited by examiner

*Primary Examiner* — Rodney G McDonald
(74) *Attorney, Agent, or Firm* — Moser Taboada (57) ABSTRACT

Methods and apparatus for processing a substrate in a process chamber include: positioning a substrate on a substrate support in a process volume so that the substrate is opposite a sputter target comprising indium tin oxide; flowing a plasma-forming gas into the process volume; and sputtering the indium tin oxide onto the substrate while applying AC bias to the substrate.

18 Claims, 5 Drawing Sheets

METHODS AND APPARATUS FOR DEPOSITING AMORPHOUS INDIUM TIN OXIDE FILM

FIELD

Embodiments of the present disclosure generally relate to substrate processing, and more particularly, to deposition of indium tin oxide films on substrates.

BACKGROUND

Indium tin oxide (ITO) is often used in optoelectronics. For example, ITO films may be used as transparent electrodes in ultra light-emitting diodes (ULEDs). ITO films may be deposited on substrates, such as semiconductor wafers, with some physical vapor deposition (PVD) processes. However, the inventors have observed that some ITO films deposited by PVD are formed with columnar crystal structure with naturally existing grain boundaries which can, in some situations, be undesirable. For example, if etching processes are performed after ITO film deposition, etchant may penetrate the ITO film through grain boundaries in the ITO film, leaving undesired compounds in underlying layers which may impact device performance.

Some approaches to forming amorphous ITO films without grain boundaries include depositing ITO films with PVD processes at low substrate temperatures (e.g., room temperature). However, low temperatures can cause the ITO film to have higher resistivity, which, for a transparent electrode, is undesirable. The resistivity may be recovered by performing additional processes (e.g., annealing). The additional processes increase manufacturing time and cost.

Thus, methods and apparatus are proposed that can provide amorphous ITO films on substrates without a need to perform additional processes to complete the ITO film, thereby reducing manufacturing time and cost.

SUMMARY

Methods and apparatus for processing substrates are provided herein. In some embodiments, a method of processing a substrate in a process chamber includes: positioning a substrate on a substrate support in a process volume so that the substrate is opposite a sputter target comprising indium tin oxide; flowing a plasma-forming gas into the process volume; and sputtering the indium tin oxide onto the substrate while applying AC bias to the substrate.

In some embodiments, a process chamber for processing a substrate includes: a chamber body having walls defining a processing volume; a substrate support having a support surface configured to support a substrate within the processing volume; a power source coupled to the substrate support, the power source configured to provide an AC bias to the substrate; a pulsed DC power supply configured to be coupled to a sputter target when the sputter target is installed during substrate processing; and a controller configured to: position the substrate on the support surface; flow a plasma-forming gas into the process volume; and sputter indium tin oxide, from the sputter target comprising indium tin oxide, onto the substrate while applying AC bias to the substrate.

In some embodiments, process kit shields for a chamber for processing a substrate include: a lower shield having a first annular body, a first upper flange at a top of the first annular body, and a channel at a bottom of the first annular body, the first annular body having a plurality of first holes surrounding an opening configured to surround a substrate during substrate processing; and an upper shield having a second annular body and an second upper flange configured to seat on the first upper flange, the second annular body extending into the channel, the second annular body having a plurality of second holes, the second holes being spaced radially inward and below the first holes, wherein the first holes and the second holes are configured to define a flow path for a plasma-forming gas from a location below the substrate support through the first holes and the second holes and above the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing substrates are provided herein. In some embodiments, the methods and apparatus described herein are provided to reduce or eliminate naturally occurring grain boundaries in ITO films deposited on substrates. In some embodiments, the methods and apparatus provide for an amorphous ITO film to be deposited on substrates in a PVD process using an AC bias that avoids multiple processes to complete the ITO film. By using an AC bias during ITO PVD deposition, argon atoms introduced over the substrate are induced to bombard the film surface thereby disturbing natural crystal formation so that grain boundaries are not formed.

Figure 1:
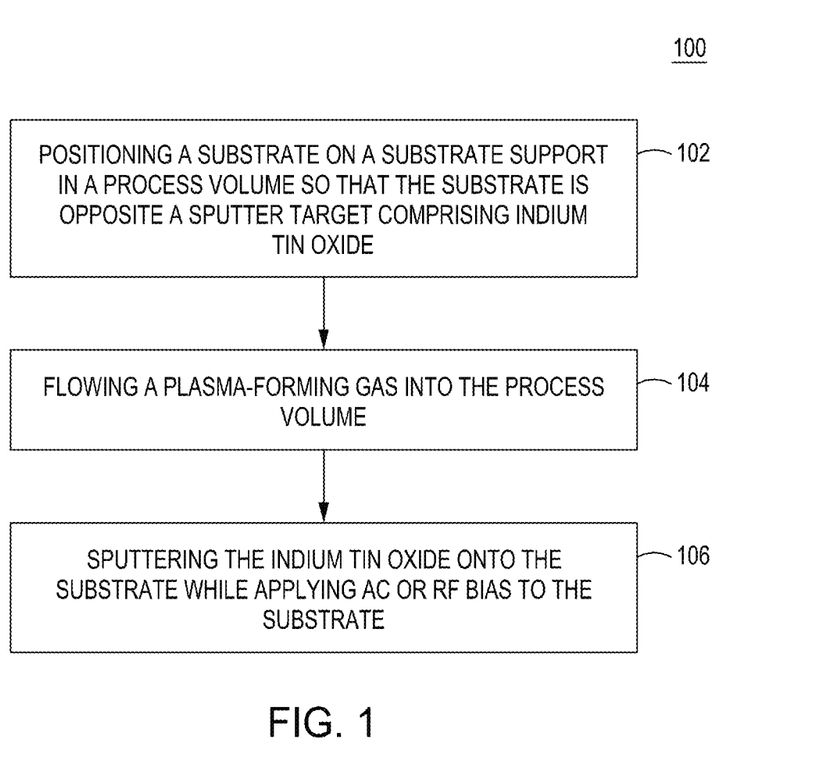
FIG. 1 is a flow chart of a method in accordance with some embodiments of the present disclosure.

FIG. 1 depicts a method 100 of processing a substrate in a process chamber in accordance with some embodiments of the present disclosure. In some embodiments, the method 100 may begin at block 102 by positioning a substrate on a substrate support in a processing volume of a process chamber, such as process chamber 300, so that the substrate is opposite a sputter target comprising indium tin oxide. In some embodiments, at block 104, the method 100 may include flowing a plasma-forming gas into the process volume. The plasma-forming gas may be directed above the substrate in the process volume by at least one hole of the plurality of holes. In some embodiments, the plasma-forming gas may be comprised of at least one of argon at a flow rate of 50 sccm to 400 sccm, or oxygen at a flow rate of 0.5 sccm to 20 sccm. In some embodiments, the method 100 may include maintaining a temperature of the substrate at 100 C to 450 C. In some embodiments, the method 100 may include maintaining a temperature of the substrate at 0 C to 50 C.

Figure 2:
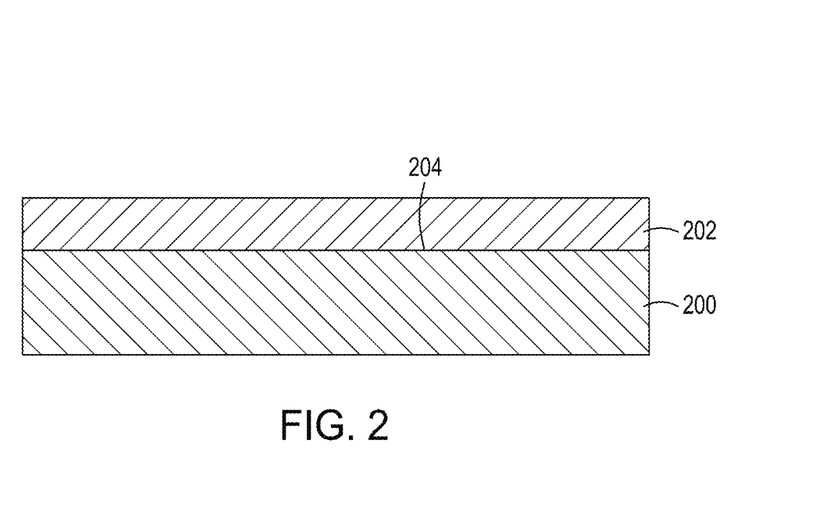
FIG. 2 is a schematic of an amorphous indium tin oxide film deposited on a substrate in accordance with some embodiments of the present disclosure.

In some embodiments, at block 106, the method 100 may include sputtering the indium tin oxide onto the substrate while applying AC bias to the substrate, thereby forming an amorphous ITO film on the substrate, as shown in FIG. 2.

In some embodiments, sputtering the indium tin oxide includes applying pulsed DC power to the sputter target. The pulsed DC power may be 500 W to 10,000 W. The pulsed DC power may be applied at a duty cycle of 5% to 15%. In some embodiments, the applied AC bias may be 100 W to 1500 W. In some embodiments, the AC bias may be applied for less than one minute.

Although the methods in accordance with the present disclosure, such as method 100, can be used to form an amorphous ITO film of uniform thickness, the methods can be used to deposit an amorphous ITO film of varying thickness. In some embodiments, ITO material may be formed as a film or layer on a substrate and subjected to additional process flows such as etching, filling and/or capping to form features, which may produce ITO films of varying thicknesses, such as the ITO film shown in FIG. 2.

In some embodiments, and as shown in FIG. 2 depicting a substrate 200 having a surface 204 on which an amorphous indium tin oxide film 202 may be deposited. The surface 204 may include at least one of silver, aluminum, or tantalum. At least some portions of the surface 204 may form a reflector. In some embodiments, the amorphous indium tin oxide film 202 may be deposited on the surface 204 as a layer of uniform thickness and later subject to additional processing, such as etching to produce a areas of various thickness.

Figure 3:
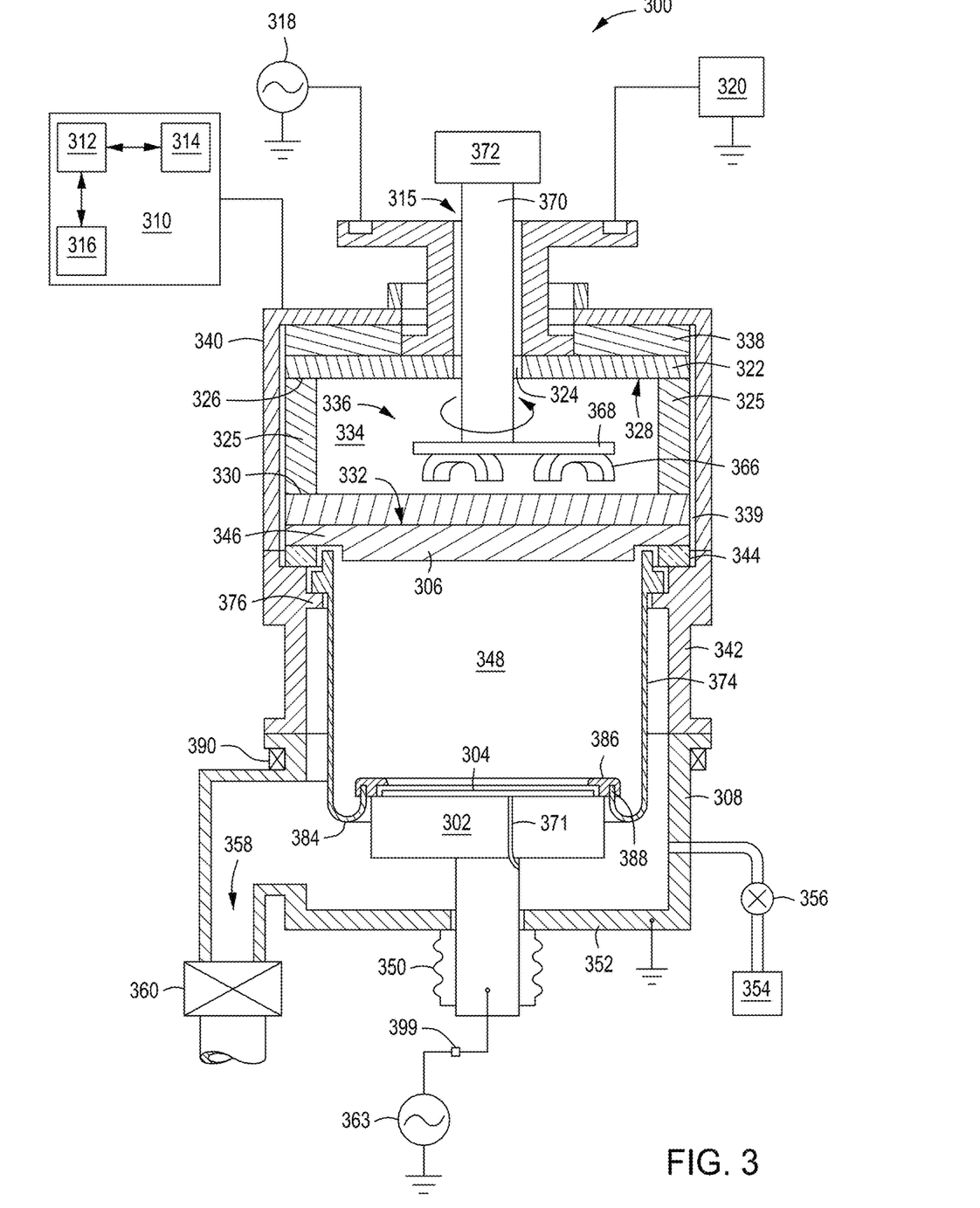
FIG. 3 is a schematic of a process chamber in accordance with some embodiments of the present disclosure.

The method 100 may be performed in a suitable PVD process chamber having DC, AC, and/or radio frequency (RF) power sources, such as a process chamber 300 described below and depicted in FIG. 3. FIG. 3 depicts a schematic, cross-sectional view of a process chamber 300 (physical vapor deposition chamber) in accordance with some embodiments of the present disclosure. Examples of suitable PVD chambers include the IMPULSE™ PVD process chambers, commercially available from Applied Materials. Inc., of Santa Clara, Calif. Other process chambers from Applied Materials. Inc or other manufacturers may also benefit from the apparatus disclosed herein.

In some embodiments, and as shown in FIG. 3, the process chamber 300 may include a chamber body 301 having chamber walls 308 defining a process volume 348 and a substrate support 302 having a support surface configured to support a substrate 304 within the processing volume 348. The chamber wall 308 may be grounded and may be as shown in FIG. 3 or may be a grounded shield (a ground shield 340 is shown covering at least some portions of the process chamber 300 above the sputter target 306. In some embodiments, the ground shield 340 could be extended below the target to enclose the substrate support 302 as well.).

In some embodiments, the process chamber includes a feed structure for coupling RF and DC energy to the sputtering sputter target 306. The feed structure is an apparatus for coupling RF and DC energy to the sputtering sputter target 306, or to an assembly containing the sputter target 306, for example, as described herein. A first end of the feed structure can be coupled to an optional RF power source 318 and a DC power source 320, which can be respectively utilized to provide RF and pulsed DC energy to the sputter target 306. For example, the DC power source 320 may be utilized to apply a negative voltage, or bias, to the sputter target 306. In some embodiments, the DC power source 320 may be a pulsed DC power supply configured to be coupled to the sputter target 306 when the sputter target is installed during substrate processing. The pulsed DC power source 320 may supply DC power of 500 W to 10,000 W during substrate processing. In some embodiments, the pulsed DC power may be applied at a duty cycle of 5% to 15%. The pulse frequency for pulsed dc may be 5% to 30%.

In some embodiments, RF energy optionally supplied by the RF power source 318 may have a suitable frequency as described above, or can range in frequency from about 2 MHz to about 60 MHZ, or, for example, non-limiting frequencies such as 2 MHZ, 13.56 MHz, 27.12 MHz, or 60 MHz can be used. In some embodiments, a plurality of RF power sources may optionally be provided (i.e., two or more) to provide RF energy in a plurality of the above frequencies. The feed structure may be fabricated from suitable conductive materials to conduct the RF and DC energy from the RF power source 318 and the DC power source 320. In embodiments, RF power source 318 is excluded, and DC power source 320 is configured to apply a negative voltage, or bias, to the sputter target 306.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RE energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter (ID) facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the sputter target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the sputter target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity 334 may be at least partially filled with a cooling fluid, such as water or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the source distribution plate 322, the conductive member 325, and the sputter target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents crosstalk between the RF feed and the body, thus improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The sputter target 306 may be supported, on a grounded conductive aluminum adapter such as 342 through a dielectric isolator 344. The sputter target 306 comprises a material to be deposited on the substrate 304 during sputtering, such as ITO. In some embodiments, the backing plate 346 may be coupled to the source distribution plate-facing surface 332 of the sputter target 306. The backing plate 346 may comprise a conductive material, such as aluminum, or the same material as the target, such that RF and DC power can be coupled to the sputter target 306 via the backing plate 346. Alternatively, the backing plate 346 may be non-conductive and may include conductive elements (not shown) such as electrical feedthroughs or the like for coupling the source distribution plate-facing surface 332 of the sputter target 306 to the second end 330 of the conductive member 325. The backing plate 346 may be included for example, to improve structural stability of the sputter target 306.

The substrate support 302 has a material-receiving, substrate support surface facing the principal surface of the target 306 and supports the substrate 304 in the processing volume 348 during sputter deposition in planar position opposite to the principal surface of the target 306. The processing volume 348 is defined as the region above the substrate support 302 during substrate processing (for example, between the target 306 and the substrate support 302 when in a processing position).

In some embodiments, the substrate support 302 may be vertically movable through a bellows 350 connected to a bottom chamber wall 352 to allow the substrate 304 to be transferred onto the substrate support 302 through a load lock valve (not shown) in the lower portion of processing the process chamber 300 and thereafter raised to a deposition, or processing position. One or more plasma-forming gases may be supplied from a gas source 354 through a mass flow controller 356 into the lower part of the process chamber 300. In some embodiments, the plasma-forming gas may be comprised of at least one of argon at a flow rate of 50 sccm to 400 sccm, or oxygen at a flow rate of 0.5 sccm to 20 sccm. An exhaust port 358 may be provided and coupled to a pump (not shown) via a valve 360 for exhausting the interior of the process chamber 300 and facilitating maintaining a desired pressure inside the process chamber 300.

In some embodiments, substrate support 302 includes an air passage 371 for providing a back-side gas to substrate 304. In embodiments, closing air passage 371 and restricting the flow of back-side gas applied to a substrate 304 will increase the temperature of the substrate 304. In some embodiments, the process chamber 300 may be configured to maintain a temperature of the substrate at 100 C to 450 C. In some embodiments, the process chamber 300 may be configured to maintain a temperature of the substrate at 0 C to 50 C.

In some embodiments, the process chamber may include an RF power source 363 coupled to the substrate support via a tuning network 399 for providing an AC bias to the substrate 304 of 100 W to 1500 W. RF power supplied by the RF power source 363 may range in frequency from about 2 MHz to about 60 MHz, for example, non-limiting frequencies such as 2 MHZ, 13.56 MHZ, or 60 MHz can be used.

When argon in a plasma-forming gas is introduced in the processing volume 348 during ITO deposition, AC bias may be applied to the substrate. The AC bias attracts the argon towards the substrate and bombards the ITO film being deposited to disturb ITO crystal formation resulting in an amorphous ITO film.

A rotatable magnetron assembly 336 may be positioned proximate a back surface (e.g., source distribution plate-facing surface 332) of the sputter target 306. The rotatable magnetron assembly 336 includes a plurality of magnets 366 supported by a base plate 368. The base plate 368 connects to a rotation shaft 370 coincident with the central axis of the process chamber 300 and the substrate 304. A motor 372 can be coupled to the upper end of the rotation shaft 370 to drive rotation of the magnetron assembly 336. The magnets 366 produce a magnetic field within the process chamber 300, generally parallel and close to the surface of the sputter target 306 to trap electrons and increase the local plasma density, which in turn increases the sputtering rate. The magnets 366 produce an electromagnetic field around the top of the process chamber 300, and magnets 366 are rotated to rotate the electromagnetic field which influences the plasma density of the process to more uniformly sputter the sputter target 306. For example, the rotation shaft 370 may make about 0 to about 150 rotations per minute.

In some embodiments, the process chamber 300 may further include a process kit shield 374 connected to a ledge 376 of the adapter 342. The adapter 342 in turn is sealed and grounded to the aluminum chamber sidewall such as chamber wall 308. Generally, the process kit shield 374 extends downwardly along the walls of the adapter 342 and the chamber wall 308 downwardly to below an upper surface of the substrate support 302 and returns upwardly until reaching an upper surface of the substrate support 302 (e.g., forming a u-shaped portion 384 at the bottom). Alternatively, the bottommost portion of the process kit shield need not be a u-shaped portion 384 and may have any suitable shape. The process kit shield 374 may include holes near the elevation of the substrate 304 to permit conductance of plasma forming gas into the processing volume 348. A cover ring 386 rests on the top of an upwardly extending lip 388 of the process kit shield 374 when the substrate support 302 is in a lower, loading position but rests on the outer periphery of the substrate support 302 when the substrate support 302 is in an upper, deposition position to protect the substrate support 302 from sputter deposition. An additional deposition ring (not shown) may be used to shield the periphery of the substrate 304 from deposition.

In some embodiments, a magnet 390 may be disposed about the process chamber 300 for selectively providing a magnetic field between the substrate support 302 and the sputter target 306. For example, as shown in FIG. 3, the magnet 390 may be disposed about the outside of the chamber wall 308 in a region just above the substrate support 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

In some embodiments, the process chamber 300 may include a controller 310 coupled to various components of the process chamber 300 to control the operation thereof. In some embodiments, and as shown in FIG. 3, the controller 310 may include a central processing unit (CPU) 312, a memory 314, and support circuits 316. The controller 310 may control the process chamber 300 directly, or via computers (or controllers) associated with particular process chamber and/or support, system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. The methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312. The controller 310 may be configured to position the substrate 304 on the support surface, flow a plasma-forming gas into the process volume 348, and sputter indium tin oxide, from the sputter target 306 comprising indium tin oxide, onto the substrate while applying AC bias to the substrate 304. In some embodiments, the controller 310 may be configured to sputter the indium tin oxide by applying pulsed DC power to the sputter target 306.

In some embodiments, the present disclosure provides a computer readable medium, having instructions stored thereon which, when executed, cause a physical vapor deposition reactor chamber to perform the methods, such as method 100, in accordance with the present disclosure.

Figure 4:
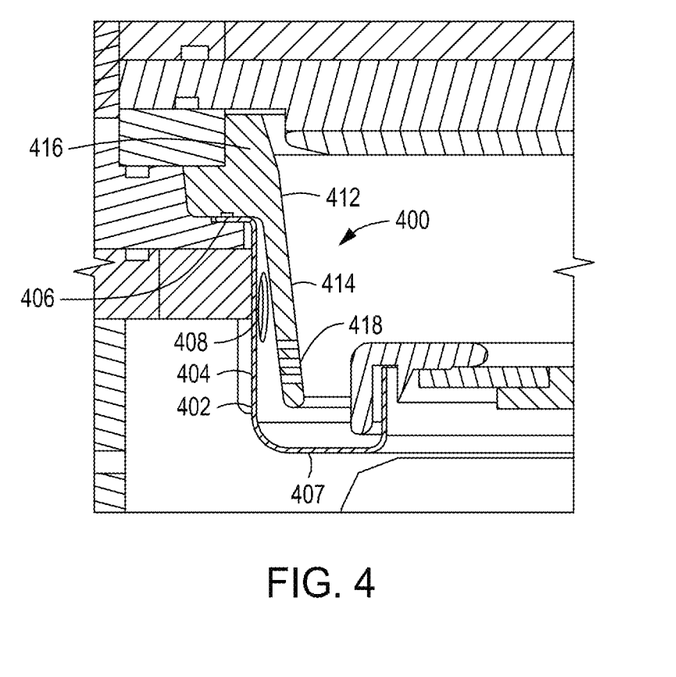
FIG. 4 is a partial section view of process kit shields in accordance with some embodiments of the present disclosure.

In some embodiments, flowing the plasma-forming gas may include introducing the plasma-forming gas through a plurality of holes in the process kit shield 374 into the processing volume 348. FIG. 4 shows process kit shields 400 for a chamber, such as process chamber 300, in accordance with some embodiments of the present disclosure. In some embodiments, and as shown in FIG. 4, the process kit shields 400 may include a lower shield 402 having a first annular body 404, a first upper flange 406 at a top of the first annular body 404, and a channel 407 at a bottom of the first annular body 404, The first annular body 404 may have a plurality of first holes 408 surrounding an opening 410 configured to surround a substrate during substrate processing.

The process kit shields 400 may include an upper shield 412 having a second annular body 414 and a second upper flange 416 configured to seat on the first upper flange 406, as shown in FIG. 4. In some embodiments, and as shown in FIG. 4, the second annular body 414 extends into the channel 407 of the lower shield 402. The upper shield 412 may shield the lower shield from ITO deposits and may advantageously direct a flow of plasma-forming gas upward and over the substrate during substrate processing, which may be advantageous for amorphous ITO film deposition as discussed more fully below.

The second annular body 414 may have a plurality of second holes 418 that are spaced radially inward and below the first holes 408. The first holes 408 and the second holes 418 are configured to define a flow path for the plasma-forming gas from a location below the substrate support (such as substrate support 302) through the first holes 408 and the second holes 418 and above the substrate support. In some embodiments, the first holes 408 are equally spaced about the first annular body 404. In some embodiments, the second holes 418 are spaced equally about the second annular body 414. The first holes 408 and the second holes 418 may be of various shapes, such as circular or oblong. In some embodiments, the second holes 418 may each have an area of 2.5 mm$^2$ to 130 mm$^2$. Sizes outside the range may not provide suitable conditions for ITO deposition. For example, second holes 418 having an area less than 2.5 mm$^2$ may not provide sufficient conductance of plasma-forming gas into the processing volume 348 for adequate edge uniformity of the ITO film and the smaller second holes 418 may be more susceptible to becoming clogged from ITO deposits. Also, second holes 418 having an area greater than 130 mm² may be too large to adequately protect the lower shield 402 from ITO deposits.

By locating the second holes 418 inwardly and below the first holes 408, a flow path for the plasma-forming gas is defined from a location below the substrate support 302 through the first holes 408 and the second holes 418 and above the substrate support 302 in the processing volume 348. Providing more plasma forming gas over the substrate increases the availability of argon over the substrate used to bombard the ITO film to sufficiently disrupt crystal formation during deposition under AC bias so that the ITO film is amorphous. Also, by sizing the second holes 418 as described above, a conductance of the plasma-forming gas can be increased in the processing volume 348, which can increase the availability and uniformity of argon in the processing volume 348 over the substrate so that during substrate processing with AC bias, the effect of argon bombardment will be more uniformly applied to the ITO film. As a result, deposition uniformity of the amorphous ITO film can be improved across the entire substrate.

Figure 5A:
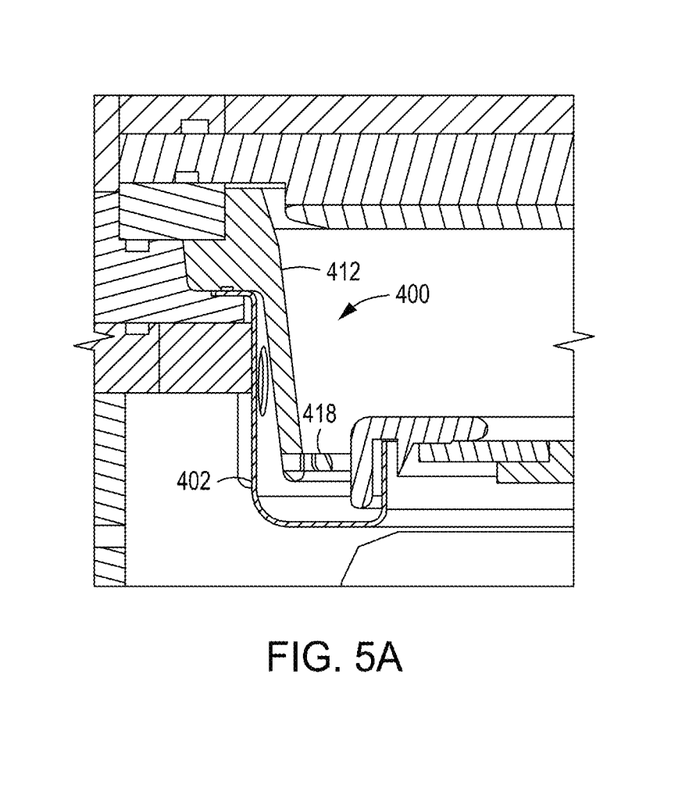
FIG. 5A is a partial section view of process kit shields in accordance with some embodiments of the present disclosure.
Figure 5B:
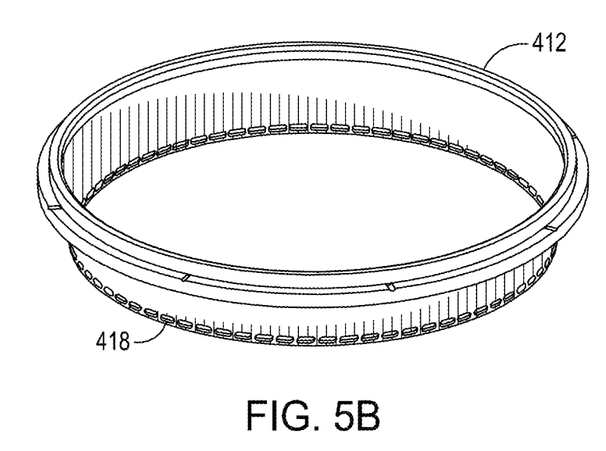
FIG. 5B is an isometric view of an upper shield shown in FIG. 5A.

FIGS. 5A and 5B show the process kit shields 400 where the second holes 418 are formed as elongated slots that are arranged in a single row. While a single row of second holes 418 is shown, multiple rows of second holes 418 are possible to increase conductance of plasma-forming gas into the processing volume 348. In some embodiments the slots may have a length of about 20 mm to 25 mm and a width of about 3 mm to 8 mm.

Figure 6A:
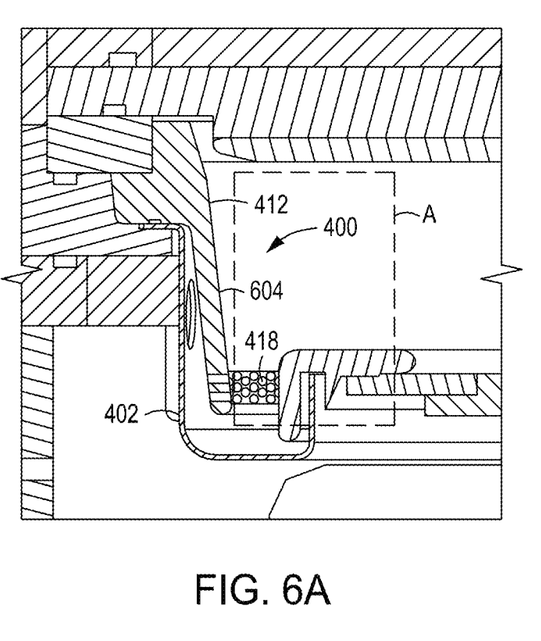
FIG. 6A is a partial section view of process kit shields in accordance with some embodiments of the present disclosure.
Figure 6B:
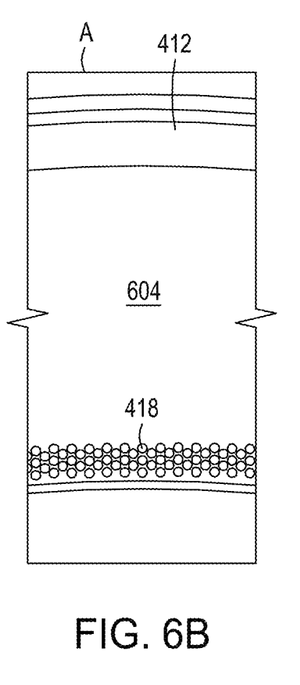
FIG. 6B shows details of a portion A of the upper shield shown in FIG. 6A.

In some embodiments, and as shown in FIGS. 6A and 6B, the second holes 418 may be relatively smaller than the second holes 418 shown in FIGS. 5A and 5B. In some embodiments, the second holes shown in FIGS. 6A and 6B may be about 1.6 mm to 2.0 mm in diameter. There may be 1500-2000 second holes 418, and the second holes may be spaced at a pitch of 2.2 mm to 2.8 mm.

Figure 7A:
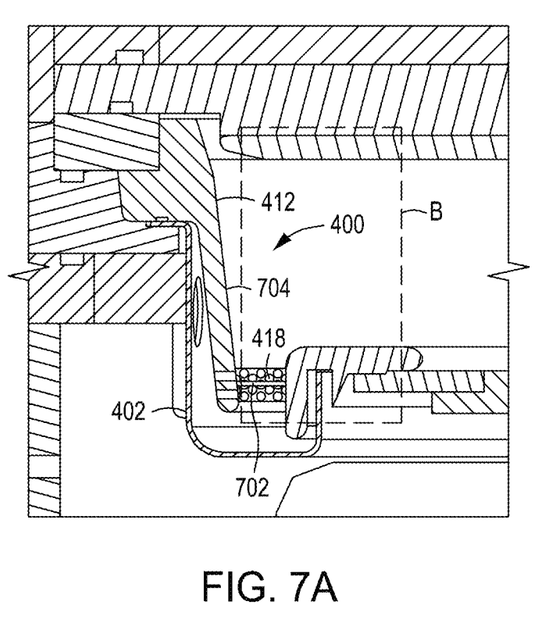
FIG. 7A is a partial section view of process kit shields in accordance with some embodiments of the present disclosure.
Figure 7B:
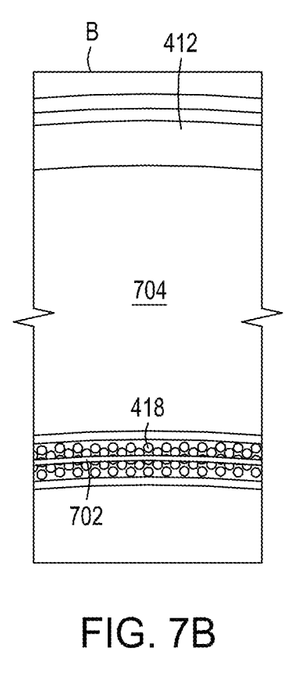
FIG. 7B shows details of a portion B of the upper shield shown in FIG. 6A.

In some embodiments, and as shown in FIGS. 7A and 7B, the upper shield 412 may be configured like the upper shield shown in FIGS. 6A and 6B, but may include one or more annular protruding ribs 702 extending about an inner surface 604 of the second annular body 414 above the plurality of second holes 418. In some embodiments, the second holes 418 may be arranged in a plurality of rows with a rib 702 between one or more rows. Each rib 702 may protrude inwardly (i.e., radially) from the inner surface 704 a certain distance to protect or otherwise shield the second holes 418 from being occluded by ITO material which could reduce conductance of plasma-forming gas through the second holes 418. In some embodiments, the rib 702 may have a vertical thickness of about 1 mm to 2 mm and may extend inwardly about 1 mm to 2 mm.

Thus, methods and apparatus for depositing ITO on substrates have been provided herein. The methods and apparatus advantageously provide for an amorphous ITO film on substrate surfaces by utilizing an AC bias during pulsed sputter deposition to attract more argon atoms toward the substrate 304 to bombard the ITO film and disrupt crystal formation. The methods advantageously provide excellent coverage uniformity of an ITO film on substrate surfaces by increasing conductance of argon into the processing volume during ITO deposition. The deposited amorphous ITO film has suitable resistivity such that no additional processes are needed to render the ITO film suitable as an electrode, such as of a ULED.

While the foregoing is directed to embodiments of the present disclosure, other and further embodiments of the disclosure may be devised without departing from the basic scope thereof.

The invention claimed is:

1. A method of processing a substrate in a process chamber, the method comprising:
   positioning a substrate on a substrate support in a process volume so that the substrate is opposite a sputter target comprising indium tin oxide;
   flowing a plasma-forming gas into the process volume; and
   sputtering the indium tin oxide onto the substrate while applying AC bias to the substrate, wherein flowing the plasma-forming gas includes introducing the plasma-forming gas through a plurality of holes in process kit shields comprising:
   a lower shield having a first annular body, a first upper flange at a top of the first annular body, and a channel at a bottom of the first annular body, the first annular body having a plurality of first holes surrounding an opening configured to surround a substrate during substrate processing; and
   an upper shield having a second annular body and a second upper flange configured to seat on the first upper flange, the second annular body having an end extending into the channel, the end spaced from the first annular body, the second annular body having a plurality of second holes, the second holes being spaced radially inward and below the first holes,
   wherein the first holes and the second holes are configured to define a flow path for the plasma-forming gas from a location below the substrate support through the first holes and the second holes to a location above the substrate.

2. The method of claim 1, wherein sputtering the indium tin oxide includes applying pulsed DC power to a sputter target.

3. The method of claim 2, wherein the pulsed DC power is 500 W to 10,000 W.

4. The method of claim 3, wherein the pulsed DC power is applied at a duty cycle of 5% to 15%.

5. The method of claim 1, wherein the plasma-forming gas is comprised of at least one of argon at a flow rate of 50 sccm to 400 sccm, or oxygen at a flow rate of 0.5 sccm to 20 sccm.

6. The method of claim 1, further comprising maintaining a temperature of the substrate at 100 C to 450 C.

7. The method of claim 1, further comprising maintaining a temperature of the substrate at 0 C to 50 C.

8. The method of claim 1, wherein the applied AC bias is 100 W to 1500 W.

9. The method of claim 1, wherein the indium tin oxide is deposited on a surface of the substrate that includes at least one of silver, aluminum, or tantalum.

10. The method of claim 1, wherein AC bias is applied for less than one minute.

11. A process chamber for processing a substrate, the process chamber comprising:
    a chamber body having walls defining a processing volume;
    a substrate support having a support surface configured to support a substrate within the processing volume;
    a power source coupled to the substrate support, the power source configured to provide an AC bias to the substrate;

a pulsed DC power supply configured to be coupled to a sputter target when the sputter target is installed during substrate processing;

a controller configured to:
- position the substrate on the support surface;
- flow a plasma-forming gas into the process volume; and
- sputter indium tin oxide, from the sputter target comprising indium tin oxide, onto the substrate while applying AC bias to the substrate; and process kit shields comprising:
- a lower shield having a first annular body, a first upper flange at a top of the first annular body, and a channel at a bottom of the first annular body, the first annular body having a plurality of first holes surrounding the substrate support; and
- an upper shield having a second annular body and a second upper flange configured to seat on the first upper flange, the second annular body having an end extending into the channel, the end spaced from the first annular body, the second annular body having a plurality of second holes, the second holes being spaced radially inward and below the first holes,
- wherein the first holes and the second holes are configured to define a flow path for a plasma-forming gas from a location below the substrate support through the first holes and the second holes to a location above the substrate.

12. The process chamber of claim 11, wherein the controller is configured to sputter the indium tin oxide by applying pulsed DC power to the sputter target.

13. The process chamber of claim 12, wherein the pulsed DC power is 500 W to 10,000 W.

14. The process chamber of claim 13, wherein the pulsed DC power is applied at a duty cycle of 5% to 15%.

15. The process chamber of claim 11, wherein the applied AC bias is 100 W to 1500 W.

16. Process kit shields for a chamber for processing a substrate, the process kit shields comprising:
- a lower shield having a first annular body, a first upper flange at a top of the first annular body, and a channel at a bottom of the first annular body, the first annular body having a plurality of first holes surrounding an opening configured to surround a substrate during substrate processing; and
- an upper shield having a second annular body and a second upper flange configured to seat on the first upper flange, the second annular body having an end extending into the channel, the end spaced from the first annular body, the second annular body having a plurality of second holes, the second holes being spaced radially inward and below the first holes,
- wherein the first holes and the second holes are configured to define a flow path for a plasma-forming gas from a location below the substrate support through the first holes and the second holes to a location above the substrate.

17. The process kit shields of claim 16, wherein each of the second holes has an area of 2.5 $mm^2$ to 130 $mm^2$.

18. The process kit shields of claim 16, further comprising an annular protruding rib extending about an inner surface of the annular body above the plurality of second holes.

* * * * *